United States Patent
Choi

(10) Patent No.: US 9,595,351 B2
(45) Date of Patent: Mar. 14, 2017

(54) APPARATUS AND METHOD FOR SELECTIVE SUB WORD LINE ACTIVATION FOR REDUCING TESTING TIME

(71) Applicant: SK hynix Inc., Icheon-si, Gyeonggi-do (KR)

(72) Inventor: Don Hyun Choi, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 14/883,281

(22) Filed: Oct. 14, 2015

(65) Prior Publication Data

US 2016/0329108 A1  Nov. 10, 2016

(30) Foreign Application Priority Data

May 8, 2015 (KR) .................. 10-2015-0064853

(51) Int. Cl.
*G11C 29/18* (2006.01)
*G11C 8/08* (2006.01)
*G11C 8/10* (2006.01)

(52) U.S. Cl.
CPC ............. *G11C 29/18* (2013.01); *G11C 8/08* (2013.01); *G11C 8/10* (2013.01); *G11C 2029/1802* (2013.01); *G11C 2029/1806* (2013.01)

(58) Field of Classification Search
CPC ...................................... G11C 29/18
USPC ........................................ 365/201
See application file for complete search history.

(56) References Cited

U.S. PATENT DOCUMENTS

| 5,406,526 A * | 4/1995 | Sugibayashi ....... G11C 11/4091 365/230.03 |
| 5,936,899 A * | 8/1999 | Jeong ..................... G11C 29/34 365/191 |
| 5,986,917 A * | 11/1999 | Lee ......................... G11C 8/14 365/201 |
| 2002/0001217 A1* | 1/2002 | Aritomi ................... G11C 8/10 365/63 |
| 2007/0070705 A1* | 3/2007 | Han ......................... G11C 8/08 365/185.23 |

(Continued)

FOREIGN PATENT DOCUMENTS

| KR | 1019970048538 A | 7/1997 |
| KR | 1019980026624 A | 7/1998 |
| KR | 1020060000273 A | 1/2006 |

*Primary Examiner* — Anthan Tran
*Assistant Examiner* — Mushfique Siddique
(74) *Attorney, Agent, or Firm* — William Park & Associates Ltd.

(57) ABSTRACT

A semiconductor memory apparatus may include a decoding unit configured to enable one of a plurality of sub word line driver enable signals by decoding a plurality of addresses while the decoding unit operates in a normal mode, and enables specific sub word line driver enable signals among the plurality of sub word line driver enable signals regardless of the plurality of addresses while the decoding unit is operating in a test mode. The semiconductor memory apparatus may include a sub word line driver group configured to include a plurality of sub word line drivers, the plurality of sub word line drivers configured for activation in response to the plurality of sub word line driver enable signals. The sub word line driver group is configured so that inactivated sub word line drivers are arranged between activated sub word line drivers while the decoding unit is operating in the test mode.

15 Claims, 5 Drawing Sheets

(56) References Cited

U.S. PATENT DOCUMENTS

| | | | | |
|---|---|---|---|---|
| 2008/0151655 A1* | 6/2008 | Kim | ................ | G11C 8/08 |
| | | | | 365/189.16 |
| 2009/0303811 A1* | 12/2009 | Kim | ................ | G11C 8/08 |
| | | | | 365/194 |
| 2009/0316513 A1* | 12/2009 | Na | ................ | G11C 8/08 |
| | | | | 365/230.06 |
| 2010/0309739 A1* | 12/2010 | An | ................ | G11C 29/02 |
| | | | | 365/201 |
| 2014/0241098 A1* | 8/2014 | Son | ................ | G11C 8/06 |
| | | | | 365/230.03 |

* cited by examiner

FIG.4

| SWLD_en<0:7> | Dec_p0<0:1> | Dec_p12<0:3> |
|---|---|---|
| SWLD_en<0> | Dec_p0<0> | Dec_p12<0> |
| SWLD_en<1> | Dec_p0<1> | Dec_p12<0> |
| SWLD_en<2> | Dec_p0<0> | Dec_p12<1> |
| SWLD_en<3> | Dec_p0<1> | Dec_p12<1> |
| SWLD_en<4> | Dec_p0<0> | Dec_p12<2> |
| SWLD_en<5> | Dec_p0<1> | Dec_p12<2> |
| SWLD_en<6> | Dec_p0<0> | Dec_p12<3> |
| SWLD_en<7> | Dec_p0<1> | Dec_p12<3> |

# APPARATUS AND METHOD FOR SELECTIVE SUB WORD LINE ACTIVATION FOR REDUCING TESTING TIME

CROSS-REFERENCES TO RELATED APPLICATION

This application claims priority under 35 U.S.C. 119(a) to Korean application No. 10-2015-0064853, filed on May 8, 2015, in the Korean intellectual property Office, which is incorporated by reference in its entirety as set forth in full.

BACKGROUND

1. Technical Field

Embodiments of the present disclosure generally relate to a semiconductor integrated circuit, and more particularly, to a semiconductor memory apparatus.

2. Related Art

Semiconductor memory apparatuses are mass-produced after a lot of tests.

The test for detecting potential defective elements in the semiconductor memory apparatuses may be performed on the semiconductor memory apparatuses. The wafer burn-in test for accelerating degradation of the semiconductor memory apparatuses may be performed on the semiconductor memory apparatuses at the wafer-level testing point.

SUMMARY

According to an embodiment, there may be provided a semiconductor memory apparatus. The semiconductor memory apparatus may include a decoding unit configured to enable one of a plurality of sub word line driver enable signals by decoding a plurality of addresses while the decoding unit is operation in a normal mode, and enable specific sub word line driver enable signals among the plurality of sub word line driver enable signals regardless of the plurality of addresses while the decoding unit is operating in a test mode. The semiconductor memory apparatus may include a sub word line driver group configured to include a plurality of sub word line drivers, the plurality of sub word line drivers configured for activation in response to the plurality of sub word line driver enable signals. The sub word line driver group is configured so that inactivated sub word line drivers are arranged between activated sub word line drivers while the decoding unit is operating in the test mode.

According to an embodiment, there may be provided a semiconductor memory apparatus. The semiconductor memory apparatus may include a decoding unit configured to generate first to eighth sub word line driver enable signals in response to first to third addresses and first and second test signals. The semiconductor memory apparatus may include a first sub word line driver group configured to include a first sub word line driver, a third sub word line driver, a fifth sub word line driver, and a seventh sub word line driver activated in response to the first sub word line driver enable signal, the third sub word line driver enable signal, the fifth sub word line driver enable signal, and the seventh sub word line driver enable signal, respectively. The semiconductor memory apparatus may include a second sub word line driver group configured to include a second sub word line driver, a fourth sub word line driver, a sixth sub word line driver, and an eighth sub word line driver activated in response to the second sub word line driver enable signal, the fourth sub word line driver enable signal, the sixth sub word line driver enable signal, and the eighth sub word line driver enable signal, respectively.

According to an embodiment, there may be provided a semiconductor memory apparatus. The semiconductor memory apparatus may include a first sub word line driver group including a plurality of sub word line drivers, and a second sub word line driver group including a plurality of sub word line drivers. The semiconductor memory apparatus may include a memory area located between the first sub word line driver group and the second sub word line driver group. The semiconductor memory apparatus may include a decoding unit configured to arrange inactivated sub word line drivers between activated sub word line drivers while the decoding unit is operating in a test mode to detect leakage currents existing between the sub word line drivers and defective elements of which leakage currents flows through.

BRIEF DESCRIPTION OF THE DRAWINGS

FIG. 4 is a view illustrating a representation of an example of a Truth table of a decoder of FIG. 2.

DETAILED DESCRIPTION

Figure 1:
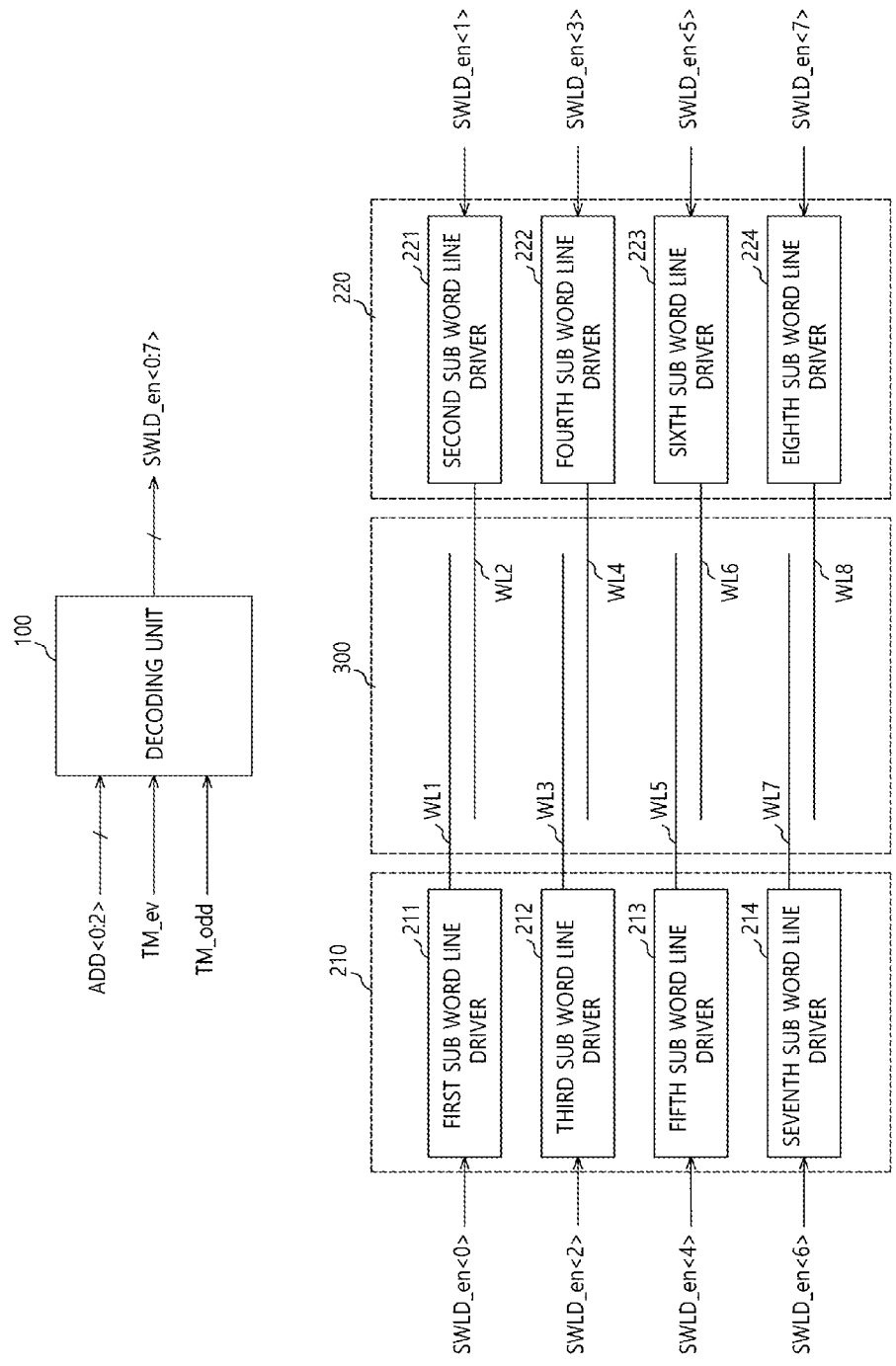
FIG. 1 is a view illustrating a representation of an example of a configuration of a semiconductor memory apparatus according to an embodiment.

Hereinafter, various examples of embodiments will be described below with reference to the accompanying drawings. Various examples of the embodiments are described herein with reference to cross-sectional illustrations that are schematic illustrations of the various examples of the embodiments (and intermediate structures). As such, variations from the shapes of the illustrations as a result, for example, of manufacturing techniques and/or tolerances, are to be expected. Thus, the embodiments should not be construed as limited to the particular shapes of regions illustrated herein but may be to include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it can be directly on the other or substrate, or intervening layers may also be present.

Referring to FIG. 1, a semiconductor memory apparatus according to an embodiment may include a decoding unit 100, first and second sub word line driver groups 210 and 220, and a memory area 300.

The decoding unit 100 may selectively enable first to eighth sub word line driver enable signals SWLD_en<0:7> in response to first to third addresses ADD<0:2> and first and second test signals TM_ev and TM_odd. For example, when the first and second test signals TM_ev and TM_odd are disabled (i.e., the decoding unit 100 is operating in a non-test mode or a normal mode), the decoding unit 100 may enable one of the first to eighth sub word line driver enable signals SWLD_en<0:7> by decoding the first to third addresses ADD<0:2>. When any one of the first and second test signals TM_ev and TM_odd is enabled (i.e., the decoding unit 100 is operating in a test mode), the decoding unit 100 may enable specific sub word line driver enable signals among the first to eighth sub word line driver enable signals SWLD_en<0:7> regardless of the first to third addresses ADD<0:2>. For example, when only the first test signal TM_ev of the first and second test signals TM_ev and TM_odd is enabled, the decoding unit 100 may enable the first sub word line driver enable signal SWLD_en<0>, the second sub word line driver enable signal SWLD_en<1>, the fifth sub word line driver enable signal SWLD_en<4>, and the sixth sub word line driver enable signal SWLD_en<5> among the first to eighth sub word line driver enable signals SWLD_en<0:7>. When only the second test signal TM_odd of the first and second test signals TM_ev and TM_odd is enabled, the decoding unit 100 may enable the third sub word line driver enable signal SWLD_en<2>, the fourth sub word line driver enable signal SWLD_en<3>, the seventh sub word line driver enable signal SWLD_en<6>, and the eighth sub word line driver enable signal SWLD_en<7> among the first to eighth sub word line driver enable signals SWLD_en<0:7>.

The first and second sub word line driver groups 210 and 220 may be arranged at both sides of the memory area 300. Each of the first and second sub word line driver groups 210 and 220 may include a plurality of sub word line drivers 211, 212, 213, and 214 and 221, 222, 223, and 224. For example, the first sub word line driver group 210 may include a first sub word line driver 211, a third sub word line driver 212, a fifth sub word line driver 213, and a seventh sub word line driver 214. The second sub word line driver group 220 may include a second sub word line driver 221, a fourth sub word line driver 222, a sixth sub word line driver 223, and an eighth sub word line driver 224.

The memory area 300 may include a data storage area, and the memory area 300 may include word lines WL1 to WL8 driven by the first to eighth sub word line drivers 211, 212, 213, 214, 221, 222, 223, and 224.

When the first sub word line driver enable signal SWLD_en<0> is enabled, the first sub word line driver 211 may be activated to enable the first word line WL1. When the second sub word line driver enable signal SWLD_en<1> is enabled, the second sub word line driver 212 may be activated to enable the second word line WL2. When the third sub word line driver enable signal SWLD_en<2> is enabled, the third sub word line driver 213 may be activated to enable the third word line WL3. When the fourth sub word line driver enable signal SWLD_en<3> is enabled, the fourth sub word line driver 214 may be activated to enable the fourth word line WL4. When the fifth sub word line driver enable signal SWLD_en<4> is enabled, the fifth sub word line driver 221 may be activated to enable the fifth word line WL5. When the sixth sub word line driver enable signal SWLD_en<5> is enabled, the sixth sub word line driver 222 may be activated to enable the sixth word line WL6. When the seventh sub word line driver enable signal SWLD_en<6> is enabled, the seventh sub word line driver 223 may be activated to enable the seventh word line WL7. When the eighth sub word line driver enable signal SWLD_en<7> is enabled, the eighth sub word line driver 224 may be activated to enable the eighth word line WL8.

Figure 2:
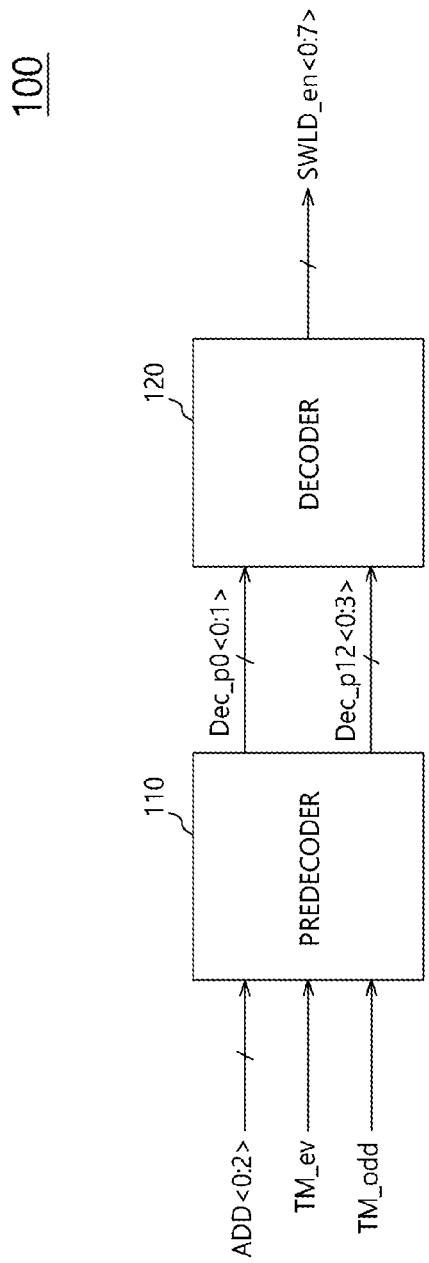
FIG. 2 is a view illustrating a representation of an example of a configuration of a decoding unit of FIG. 1.

Referring to FIG. 2, the decoding unit 100 may include a predecoder 110 and a decoder 120.

The predecoder 110 may generate first and second predecoding signals Dec_p0<0:1> and third to sixth predecoding signals Dec_p12<0:3> in response to the first to third addresses ADD<0:2> and the first and second test signals TM_ev and TM_odd. For example, when the first and second test signals TM_ev and TM_odd are disabled, the predecoder 110 may generate the first and second predecoding signals Dec_p0<0:1> and the third to sixth predecoding signals Dec_p12<0:3> in response to the first to third addresses ADD<0:2>. When only the first test signal TM_ev of the first and second test signals TM_ev and TM_odd is enabled, the predecoder 110 may fix (i.e., set) the first and second predecoding signals Dec_p0<0:1>, and the third and fifth predecoding signals Dec_p12<0> and Dec_p12<2> to a specific level (for example, high level). When only the second test signal TM_odd of the first and second test signals TM_ev and TM_odd is enabled, the predecoder 110 may fix the first and second predecoding signals Dec_p0<0:1>, and the fourth and sixth predecoding signals Dec_p12<1> and Dec_p12<3> to a specific level (for example, high level).

Figure 3:
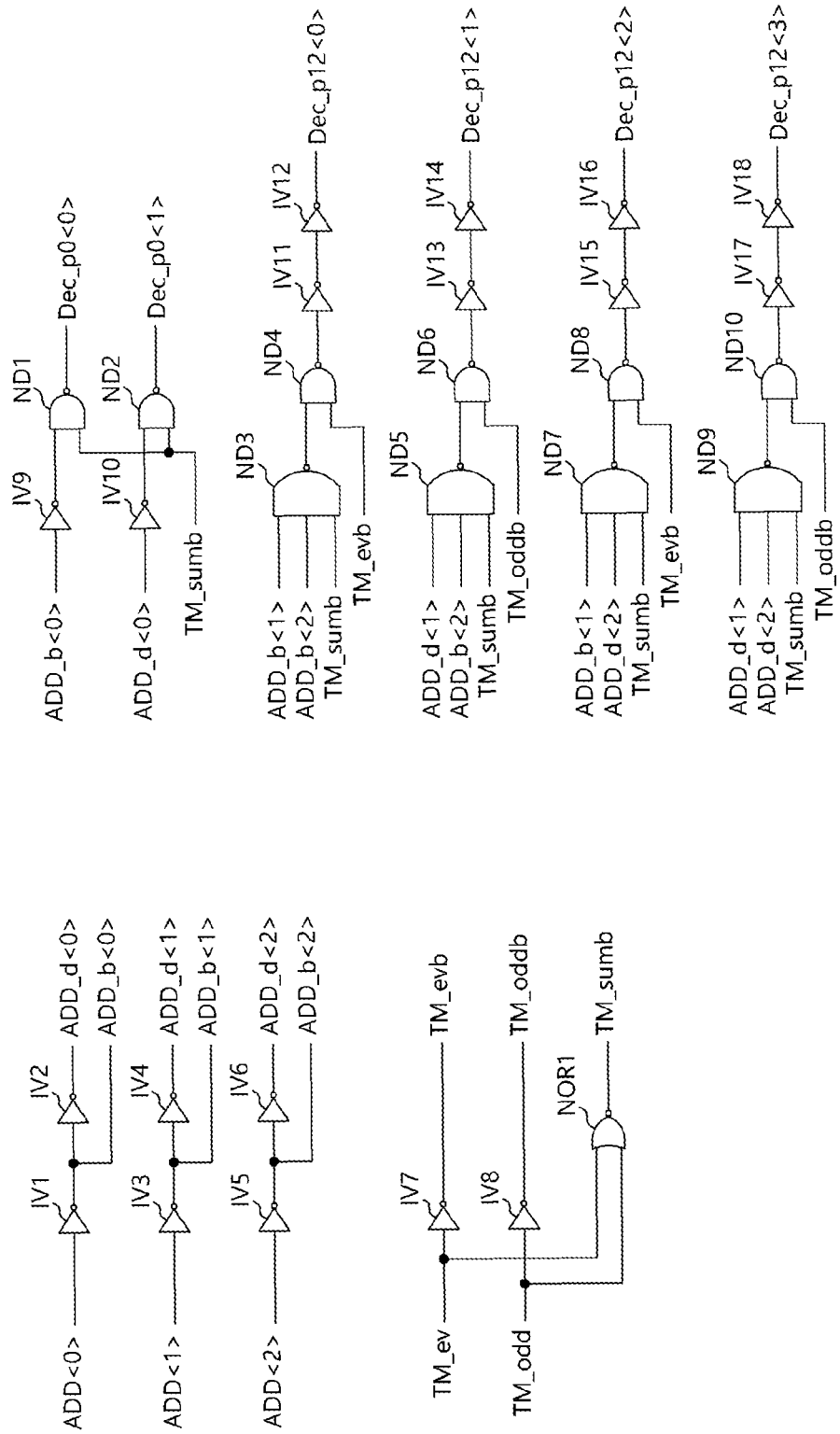
FIG. 3 is a view illustrating a representation of an example of a configuration of a predecoder of FIG. 2.

Referring to FIG. 3, the predecoder 110 may include first to eighteenth inverts IV1 to IV18, a NOR gate NOR1, and first to tenth NAND gates ND1 to ND10. The first inverter IV1 may receive the first address ADD<0> and output a first inverted address ADD_b<0>. The second inverter IV2 may receive the first inverted address ADD_b<0> and output a first delayed address ADD_d<0>. The third inverter IV3 may receive the second address ADD<1> and output a second inverted address ADD_b<1>. The fourth inverter IV4 may receive the second inverted address ADD_b<1> and output a second delayed address ADD_d<1>. The fifth inverter IV5 may receive the third address ADD<2> and output a third inverted address ADD_b<2>. The sixth inverter IV6 may receive the third inverted address ADD_b<2> and output a third delayed address ADD_d<2>. The seventh inverter IV7 may receive the first test signal TM_ev and output a first inverted test signal TM_evb. The eighth inverter IV8 may receive the second test signal TM_odd and output a second inverted test signal TM_oddb. The NOR gate NOR1 may receive the first and second test signals TM_ev and TM_odd and output a test combination signal TM_sumb. The ninth inverter IV9 may receive the first inverted address ADD_b<0>. The tenth inverter IV10 may receive the first delayed address ADD_d<0>. The first NAND gate ND1 may receive an output signal of the ninth inverter IV9 and the test combination signal TM_sumb and output the first predecoding signal Dec_p0<0>. The second NAND gate ND2 may receive an output signal of the tenth inverter IV10 and the test combination signal TM_sumb and output the second predecoding signal Dec_p0<1>. The third NAND gate ND3 may receive the second inverted address ADD_b<1>, the third inverted address ADD_b<2>, and the test combination signal TM_sumb. The fourth NAND gate ND4 may receive an output signal of the third NAND gate ND3 and the first inverted test signal TM_evb. The eleventh inverter IV11 may receive an output signal of the fourth NAND gate ND4. The twelfth inverter IV12 may receive an output signal of the eleventh inverter IV11 and output the third predecoding signal Dec_p12<0>. The fifth NAND gate ND5 may receive the second delayed address ADD_d<1>, the third inverted address ADD_b<2>, and the test combination signal TM_sumb. The sixth NAND gate ND6 may receive an output signal of the fifth NAND gate ND5 and the second inverted test signal TM_oddb. The thirteenth inverter IV13 may receive an output signal of the sixth NAND gate ND6. The fourteenth inverter IV14 may receive an output signal of the thirteenth inverter IV13 and output the fourth predecoding signal Dec_p12<1>. The seventh NAND gate ND7 may receive the second inverted address ADD_b<1>, the third delayed address ADD_d<2>, and the test combination signal TM_sumb. The eighth NAND gate ND8 may receive an output signal of the seventh NAND gate ND7 and the first inverted test signal TM_evb. The fifteenth inverter IV15 may receive an output signal of the eighth NAND gate ND8. The sixteenth inverter IV16 may receive an output signal of the fifteenth inverter IV15 and output the fifth predecoding signal Dec_p12<2>. The ninth NAND gate ND9 may receive the second delayed address ADD_d<1>, the third delayed address ADD_d<2>, and the test combination signal TM_sumb. The tenth NAND gate ND10 may receive an output signal of the ninth NAND gate ND9 and the second inverted test signal TM_oddb. The seventeenth inverter IV17 may receive an output signal of the tenth NAND gate ND10. The eighteenth inverter IV18 may receive an output signal of the seventeenth inverter IV17 and output the sixth predecoding signal Dec_p12<3>.

The test combination signal TM_sumb outputted from the NOR gate NOR1 may be a signal enabled to a low level when any one of the first and second test signals TM_ev and TM_odd is enabled to a high level.

The operation of the predecoder 110 having the above-described configuration will be described below.

When the test combination signal TM_sumb is disabled to the high level, the first inverted address ADD_b<0> may be output as the first predecoding signal Dec_p0<0>.

When the test combination signal TM_sumb is disabled to the high level, the first delayed address ADD_d<0> may be output as the second predecoding signal Dec_p0<1>.

When the test combination signal TM_sumb is enabled to the low level, the first and second predecoding signals Dec_p0<0:1> may be fixed to the high level.

When the test combination signal TM_sumb and the first inverted test signal TM_evb are disabled to the high level, the third predecoding signal Dec_p12<0> may be generated in response to the second and third inverted addresses ADD_b<1> and ADD_b<2>. When the test combination signal TM_sumb and the first inverted test signal TM_evb are enabled to the low level, the third predecoding signal Dec_p12<0> may be fixed to the high level.

When the test combination signal TM_sumb and the second inverted test signal TM_oddb are disabled to the high level, the fourth predecoding signal Dec_p12<1> may be generated in response to the second delayed address ADD_d<1> and the third inverted addresses ADD_b<2>. When the test combination signal TM_sumb and the second inverted test signal TM_oddb are enabled to the low level, the fourth predecoding signal Dec_p12<1> may be fixed to the high level.

When the test combination signal TM_sumb and the first inverted test signal TM_evb are disabled to the high level, the fifth predecoding signal Dec_p12<2> may be generated in response to the second inverted addresses ADD_b<1> and the third delayed address ADD_d<2>. When the test combination signal TM_sumb and the first inverted test signal TM_evb are enabled to the low level, the fifth predecoding signal Dec_p12<2> may be fixed to the high level.

When the test combination signal TM_sumb and the second inverted test signal TM_oddb are disabled to the high level, the sixth predecoding signal Dec_p12<3> may be generated in response to the second and third delayed addresses ADD_d<1> and ADD_d<2>. When the test combination signal TM_sumb and the second inverted test signal TM_oddb are enabled to the low level, the sixth predecoding signal Dec_p12<3> may be fixed to the high level.

The decoder 120 of FIG. 2 may generate the first to eighth sub word line driver enable signals SWLD_en<0:7> in response to the first to sixth predecoding signals Dec_p0<0:1> and Dec_p12<0:3>.

The operation of the decoder 120 will be described with reference to a Truth table as illustrated in FIG. 4.

When the first and third predecoding signals Dec_p0<0> and Dec_p12<0> are the high levels, the decoder 120 may enable the first sub word line driver enable signal SWLD_en<0>.

When the second and third predecoding signals Dec_p0<1> and Dec_p12<0> are the high levels, the decoder 120 may enable the second sub word line driver enable signal SWLD_en<1>.

When the first and fourth predecoding signals Dec_p0<0> and Dec_p12<1> are the high levels, the decoder 120 may enable the third sub word line driver enable signal SWLD_en<2>.

When the second and fourth predecoding signals Dec_p0<1> and Dec_p12<1> are the high levels, the decoder 120 may enable the fourth sub word line driver enable signal SWLD_en<3>.

When the first and fifth predecoding signals Dec_p0<0> and Dec_p12<2> are the high levels, the decoder 120 may enable the fifth sub word line driver enable signal SWLD_en<4>.

When the second and fifth predecoding signals Dec_p0<1> and Dec_p12<2> are the high levels, the decoder 120 may enable the sixth sub word line driver enable signal SWLD_en<5>.

When the first and sixth predecoding signals Dec_p0<0> and Dec_p12<3> are the high levels, the decoder 120 may enable the seventh sub word line driver enable signal SWLD_en<6>.

When the second and sixth predecoding signals Dec_p0<1> and Dec_p12<3> are the high levels, the decoder 120 may enable the eighth sub word line driver enable signal SWLD_en<7>.

The operation of the semiconductor memory apparatus having an above-described configuration according to an embodiment will be described below.

The decoding unit 100 may generate the first to eighth sub word line driver enable signals SWLD_en<0:7> in response to the first to third addresses ADD<0:2> and the first and second test signals TM_ev and TM-odd.

When the first and second test enable signals TM_ev and TM_odd are disabled, the decoding unit 100 may enable one sub word line driver enable signal SWLD_en<i> among the first to eighth sub word line driver enable signals SWLD_en<0:7> by decoding the first to third addresses ADD<0:2>.

When any one of the first and second test signals TM_ev and TM_odd is enabled, the decoding unit 100 may enable the first and second sub word line driver enable signals SWLD_en<0> and SWLD_en<1>, and the fifth and sixth sub word line driver enable signals SWLD_en<4> and SWLD_en<5> regardless of the first to third addresses ADD<0:2>.

When the second test signal TM_odd of the first and second test signals TM_ev and TM_odd is enabled, the decoding unit 100 may enable the third and fourth sub word line driver enable signals SWLD_en<2> and SWLD_en<3>, and the seventh and eighth sub word line driver enable signals SWLD_en<6> and SWLD_en<7> regardless of the first to third addresses ADD<0:2>.

The operation of the decoding unit 100 will be described in below with reference to FIGS. 2 to 4.

Referring to FIG. 2, the decoding unit 100 may include the predecoder 110 and the decoder 120.

The predecoder 110 may generate the first to sixth predecoding signals Dec_p0<0:1> and Dec_p12<0:3> in response to the first to third addresses ADD<0:2> and the first and second test signals TM_ev and TM_odd. For example, when the first and second test signals TM_ev and TM_odd are disabled, the predecoder 110 may generate the first to sixth predecoding signals Dec_p0<0:1> and Dec_p12<0:3> in response to the first to third addresses ADD<0:2>. When the first and second test signals TM_ev and TM_odd are disabled, the predecoder 110 may generate the first and second predecoding signals Dec_p0<0:1> in response to the first address ADD<0> and generate the third to sixth predecoding signals Dec_p12<0:3> in response to the second and third addresses ADD<1:2>. When the first test signal TM_ev of the first and second test signals TM_ev and TM_odd is enabled, the predecoder 110 may fix the first and second predecoding signals Dec_p0<0:1> and the third and fifth predecoding signals Dec_p12<0> and Dec_p12<2> to the high level regardless of the first to third addresses ADD<0:2>. When the second test signal TM_odd of the first and second test signals TM_ev and TM_odd is enabled, the predecoder 110 may fix the first and second predecoding signals Dec_p0<0:1>, and the fourth and sixth predecoding signals Dec_p12<1> and Dec_p12<3> to the high level regardless of the first to third addresses ADD<0:2>.

Referring to FIG. 3, when any one of the first and second test signals TM_ev and TM_odd is enabled to the high level, the test combination signal TM_sumb may be enabled to the low level.

When the test combination signal TM_sumb is enabled to the low level, the first and second predecoding signals Dec_p0<0> and Dec_p0<1> may be fixed to the high level.

When only the first test signal TM_ev is enabled to the high level, the first inverted test signal TM_evb becomes the low level, and when the first inverted test signal TM_evb is the low level, the third and fifth predecoding signals Dec_p12<0> and Dec_p12<2> are fixed to the high level. When the first test signal TM_ev is enabled to the high level and the second test signal TM_odd is disabled to the low level, the fourth and sixth predecoding signals Dec_p12<1> and Dec_p12<3> are fixed to the low level.

When only the second test signal TM_odd is enabled to the high level, the second inverted test signal TM_oddb becomes the low level, and when the second inverted test signal TM_oddb is the low level, the fourth and sixth predecoding signals Dec_p12<1> and Dec_p12<3> are fixed to the high level. When the second test signal TM_odd is enabled to the high level and the first test signal TM_ev is disabled to the low level, the third and fifth predecoding signals Dec_p12<0> and Dec_p12<2> are fixed to the low level.

The decoder 120 of FIG. 3 may generate the first to eighth sub word line driver enable signals SWLD_en<0:7> by decoding the generated first to sixth decoding signals Dec_p0<0:1> and Dec_p12<0:3> as illustrated in a Truth table of FIG. 4.

For example, when the first and third predecoding signals Dec_p0<0> and Dec_p12<0> are the high levels, the decoder 120 may enable the first sub word line driver enable signal SWLD_en<0>.

When the second and third predecoding signals Dec_p0<1> and Dec_p12<0> are the high levels, the decoder 120 may enable the second sub word line driver enable signal SWLD_en<1>.

When the first and fourth predecoding signals Dec_p0<0> and Dec_p12<1> are the high levels, the decoder 120 may enable the third sub word line driver enable signal SWLD_en<2>.

When the second and fourth predecoding signals Dec_p0<1> and Dec_p12<1> are the high levels, the decoder 120 may enable the fourth sub word line driver enable signal SWLD_en<3>.

When the first and fifth predecoding signals Dec_p0<0> and Dec_p12<2> are the high levels, the decoder 120 may enable the fifth sub word line driver enable signal SWLD_en<4>.

When the second and fifth predecoding signals Dec_p0<1> and Dec_p12<2> are the high levels, the decoder 120 may enable the sixth sub word line driver enable signal SWLD_en<5>.

When the first and sixth predecoding signals Dec_p0<0> and Dec_p12<3> are the high levels, the decoder 120 may enable the seventh sub word line driver enable signal SWLD_en<6>.

When the second and sixth predecoding signals Dec_p0<1> and Dec_p12<3> are the high levels, the decoder 120 may enable the eighth sub word line driver enable signal SWLD_en<7>.

Therefore, when the first and second predecoding signals Dec_p0<0:1> and the third and fifth predecoding signals Dec_p12<0> and Dec_p12<2> are fixed to the high level, the first and second sub word line driver enable signals SWLD_en<0:1> and the fifth and sixth sub word line driver enable signals SWLD_en<4:5> may be enabled.

When the first and second predecoding signals Dec_p0<0:1> and the fourth and sixth predecoding signals Dec_p12<1> and Dec_p12<3> are fixed to the high level, the third and fourth sub word line driver enable signals SWLD_en<2:3> and the seventh and eighth sub word line driver enable signals SWLD_en<6:7> may be enabled.

Referring to FIG. 1, in the semiconductor memory apparatus according to an embodiment, when the first test signal TM_ev is enabled, the first and second sub word line driver enable signals SWLD_en<0:1> and the fifth and sixth sub word line driver enable signals SWLD_en<4:5> among the first to eighth sub word line driver enable signals SWLD_en<0:7> may be enabled.

When the first and second sub word line driver enable signals SWLD_en<0:1> and the fifth and sixth sub word line driver enable signals SWLD_en<4:5> are enabled, the first and second sub word line drivers 211 and 221 and the fifth and sixth sub word line drivers 213 and 223 among the first to eighth sub word line drivers 211 to 214 and 221 to 224 may be activated.

when the second test signal TM_odd is enabled, the third and fourth sub word line driver enable signals SWLD_en<2:3> and the seventh and eighth sub word line driver enable signals SWLD_en<6:7> among the first to eighth sub word line driver enable signals SWLD_en<0:7> may be enabled.

When the third and fourth sub word line driver enable signals SWLD_en<2:3> and the seventh and eighth sub word line driver enable signals SWLD_en<6:7> are enabled, the third and fourth sub word line drivers 212 and 222 and the seventh and eighth sub word line drivers 214 and 224 among the first to eighth sub word line drivers 211 to 214 and 221 to 224 may be activated.

For example, to detect the potential defective elements of the sub word line drivers, the semiconductor memory apparatus according to an embodiment may activate the first and second sub word line drivers 211 and 221 and activate the fifth and sixth sub word line drivers 213 and 223 by enabling the first test signal TM_ev. In the first sub word line driver group 210 including the first, third, fifth, and seventh sub word line drivers 211, 212, 213, and 214, the inactivated third sub word line driver 212 may be arranged between the activated first and fifth sub word line drivers 211 and 213. In the second sub word line driver group 220 including the second, fourth, sixth, and eighth sub word line drivers 221, 222, 223, and 224, the inactivated fourth sub word line driver 222 may be arranged between the activated second and sixth sub word line drivers 221 and 223. The semiconductor memory apparatus may detect leakage currents which may exist between the sub word line drivers and the potential defective elements which the leakage currents may flow therethrough by arranging the inactivated sub word line driver between the activated sub word line drivers in the test.

In an example, to detect the potential defective elements of the sub word line drivers, the semiconductor memory apparatus according to an embodiment may activate the third and fourth sub word line drivers 212 and 222 and activate the seventh and eighth sub word line drivers 214 and 224 by enabling the second test signal TM_odd. In the first sub word line driver group 210 including the first, third, fifth, and seventh sub word line drivers 211, 212, 213, and 214, the inactivated fifth sub word line driver 213 may be arranged between the activated third and seventh sub word line drivers 212 and 214. In the second sub word line driver group 220 including the second, fourth, sixth, and eighth sub word line drivers 221, 222, 223, and 224, the inactivated sixth sub word line driver 223 may be arranged between the activated fourth and eighth sub word line drivers 222 and 224. The semiconductor memory apparatus may detect leakage currents which may exist between the sub word line drivers and the potential defective elements which the leakage currents may flow therethrough by arranging the inactivated sub word line driver between the activated sub word line drivers in the test.

Figure 5:
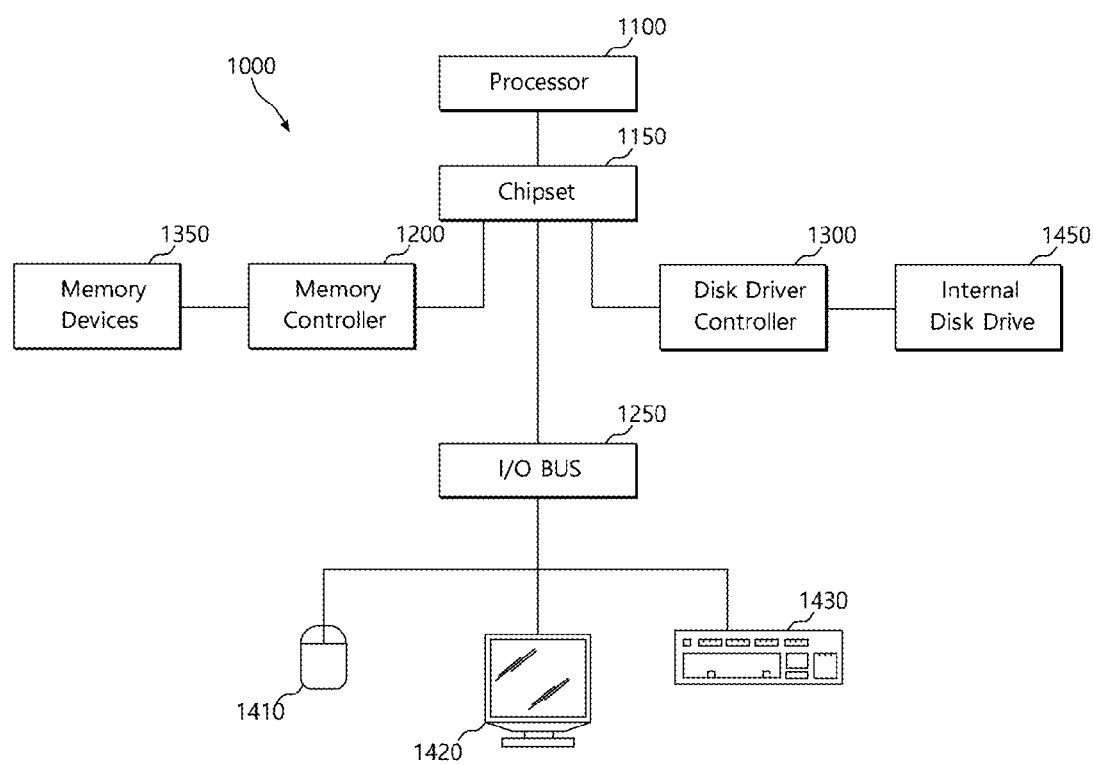
FIG. 5 illustrates a block diagram of an example of a representation of a system employing a semiconductor memory apparatus in accordance with the various embodiments discussed above with relation to FIGS. 1-4.

The semiconductor memory apparatuses discussed above (i.e., see FIGS. 1-4) are particular useful in the design of memory devices, processors, and computer systems. For example, referring to FIG. 5, a block diagram of a system employing a semiconductor memory apparatus in accordance with the various embodiments are illustrated and generally designated by a reference numeral 1000. The system 1000 may include one or more processors (i.e., Processor) or, for example but not limited to, central processing units ("CPUs") 1100. The processor (i.e., CPU) 1100 may be used individually or in combination with other processors (i.e., CPUs). While the processor (i.e., CPU) 1100 will be referred to primarily in the singular, it will be understood by those skilled in the art that a system 1000 with any number of physical or logical processors (i.e., CPUs) may be implemented.

A chipset 1150 may be operably coupled to the processor (i.e., CPU) 1100. The chipset 1150 is a communication pathway for signals between the processor (i.e., CPU) 1100 and other components of the system 1000. Other components of the system 1000 may include a memory controller 1200, an input/output ("I/O") bus 1250, and a disk driver controller 1300. Depending on the configuration of the system 1000, any one of a number of different signals may be transmitted through the chipset 1150, and those skilled in the art will appreciate that the routing of the signals throughout the system 1000 can be readily adjusted without changing the underlying nature of the system 1000.

As stated above, the memory controller 1200 may be operably coupled to the chipset 1150. The memory controller 1200 may include at least one semiconductor memory apparatus as discussed above with reference to FIGS. 1-4. Thus, the memory controller 1200 can receive a request provided from the processor (i.e., CPU) 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one semiconductor memory apparatus as discussed above with relation to FIGS. 1-4, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420, and 1430. The I/O devices 1410, 1420, and 1430 may include, for example but are not limited to, a mouse 1410, a video display 1420, or a keyboard 1430. The I/O bus 1250 may employ any one of a number of communications protocols to communicate with the I/O devices 1410, 1420, and 1430. In an embodiment, the I/O bus 1250 may be integrated into the chipset 1150.

The disk driver controller 1300 may be operably coupled to the chipset 1150. The disk driver controller 1300 may serve as the communication pathway between the chipset 1150 and one internal disk driver 1450 or more than one internal disk driver 1450. The internal disk driver 1450 may facilitate disconnection of the external data storage devices by storing both instructions and data. The disk driver controller 1300 and the internal disk driver 1450 may communicate with each other or with the chipset 1150 using virtually any type of communication protocol, including, for example but not limited to, all of those mentioned above with regard to the I/O bus 1250.

It is important to note that the system 1000 described above in relation to FIG. 5 is merely one example of a system 1000 employing a semiconductor memory apparatus as discussed above with relation to FIGS. 1-4. In alternate embodiments, such as, for example but not limited to, cellular phones or digital cameras, the components may differ from the embodiments illustrated in FIG. 5.

The above embodiments are illustrative and not limitative. Various alternatives and equivalents are possible. The description is not limited by the embodiments described herein. Nor is the description limited to any specific type of semiconductor device. Other additions, subtractions, or modifications are obvious in view of the present disclosure and are intended to fall within the scope of the appended claims.

What is claimed is:

1. A semiconductor memory apparatus comprising:
a decoding unit configured to enable one of a plurality of sub word line driver enable signals by decoding a plurality of addresses while the decoding unit is operating in a normal mode, and enable predetermined sub word line driver enable signals among the plurality of sub word line driver enable signals regardless of the plurality of addresses while the decoding unit is operating in a test mode; and
a sub word line driver group configured to include a plurality of sub word line drivers, the plurality of sub word line drivers configured for activation in response to the plurality of sub word line driver enable signals,
wherein the sub word line driver group is configured so that inactivated sub word line drivers are arranged between activated sub word line drivers while the decoding unit is operating in the test mode.

2. The semiconductor memory apparatus of claim 1, wherein the decoding unit includes:
a predecoder configured to generate a plurality of predecoding signals in response to a test signal and the plurality of addresses; and
a decoder configured to generate the plurality of sub word line driver enable signals by decoding the plurality of predecoding signals.

3. The semiconductor memory apparatus of claim 2, wherein the predecoder is configured to generate the plurality of predecoding signals in response to the plurality of addresses when the test signal is disabled; and to enable only predetermined predecoding signals among the plurality of predecoding signals regardless of the plurality of addresses when the test signal is enabled.

4. The semiconductor memory apparatus of claim 3, wherein the plurality of addresses include first to third addresses,
the plurality of predecoding signals include first to sixth predecoding signals, and
the predecoder is configured to generate the first to sixth predecoding signals in response to the first to third addresses when the test signal is disabled; and to set the first and second predecoding signals to a predetermined level and enable non-continuous predecoding signals among the third to sixth predecoding signals when the test signal is enabled.

5. A semiconductor memory apparatus comprising:
a decoding unit configured to enable one of first to eighth sub word line driver enable signals in response to first to third addresses in a normal mode and enable predetermined sub word line driver enable signals regardless of the addresses in response to first test signal and second test signal;
a first sub word line driver group configured to include a first sub word line driver, a third sub word line driver, a fifth sub word line driver, and a seventh sub word line driver activated in response to the first sub word line driver enable signal, the third sub word line driver enable signal, the fifth sub word line driver enable signal, and the seventh sub word line driver enable signal, respectively; and
a second sub word line driver group configured to include a second sub word line driver, a fourth sub word line driver, a sixth sub word line driver, and an eighth sub word line driver activated in response to the second sub word line driver enable signal, the fourth sub word line driver enable signal, the sixth sub word line driver enable signal, and the eighth sub word line driver enable signal, respectively.

6. The semiconductor memory apparatus of claim 5, wherein the decoding unit is configured to generate the first to eighth sub word line driver enable signals so that inactive sub word line drivers are arranged between activated sub word line drivers in response to the first and second test signals in the first and second sub word line driver groups.

7. The semiconductor memory apparatus of claim 5, wherein the decoding unit is configured to enable one of the first to eighth sub word line driver enable signals by decoding the first to third addresses when the first and second test signals are disabled; to enable the first and second sub word line driver enable signals and the fifth and sixth sub word line driver enable signals when the first test signal of the first and second test signals is enabled; and to enable the third and forth sub word line driver enable signals and the seventh and eighth sub word line driver enable signals when the second test signal of the first and second test signals is enabled.

8. The semiconductor memory apparatus of claim 5, wherein the decoding unit includes:
a predecoder configured to generate first to sixth predecoding signals in response to the first and second test signals and the first to third addresses; and
a decoder configured to generate the first to eighth sub word line driver enable signals in response to the first to sixth predecoding signals.

9. The semiconductor memory apparatus of claim 8, wherein the predecoder is configured to generate the first to sixth predecoding signals in response to the first to third addresses when the first and second test signals are disabled; to set the first and second predecoding signals to a first level regardless of the first address when any one of the first and second test signals is enabled; to set the third and fifth predecoding signals to the first level and set the fourth and sixth predecoding signals to a second level regardless of the second and third addresses when the first test signal is enabled; and to set the fourth and sixth predecoding signals to the first level and set the third and fifth predecoding signals to the second level regardless of the second and third addresses when the second test signal is enabled.

10. A semiconductor memory apparatus comprising:
a first sub word line driver group including a plurality of sub word line drivers;
a second sub word line driver group including a plurality of sub word line drivers;
a memory area located between the first sub word line driver group and the second sub word line driver group; and
a decoding unit configured to arrange inactivated sub word line drivers between activated sub word line drivers while the decoding unit is operating in a test mode to detect leakage currents existing between the sub word line drivers and defective elements of which leakage currents flows through,
wherein the decoding unit is configured to enable one of a plurality of sub word line driver enable signals by decoding a plurality of addresses while the decoding unit is operating in a normal mode, and enable predetermined sub word line driver enable signals among the plurality of sub word line driver enable signals regardless of the plurality of addresses while the decoding unit is operating in a test mode.

11. The semiconductor memory apparatus of claim 10, wherein the decoding unit enables predetermined sub word line drivers from the pluralities of sub word line drivers in response to a plurality of addresses while the decoding unit is operating in a normal mode, and enables predetermined sub word line drivers among the pluralities of sub word line drivers regardless of the plurality of addresses while the decoding unit is operating in the test mode.

12. The semiconductor memory apparatus of claim 11, wherein the decoding unit is configured to operate in a test mode in response to either a first or second test signal.

13. The semiconductor memory apparatus of claim 12, wherein the first sub word line driver group includes a first sub word line driver located between second and third sub word line drivers, wherein the decoding unit is configured to activate the second and third sub word line drivers of the first sub word line driver group and leave the first sub word line driver of the first sub word line driver group inactivated in response to the first test signal, wherein the second sub word line driver group includes a first sub word line driver located between second and third sub word line drivers, and wherein the decoding unit is configured to activate the second and third sub word line drivers of the second sub word line driver group and leave the first sub word line driver of the second sub word line driver group inactivated in response to the first test signal.

14. The semiconductor memory apparatus of claim 13, wherein the first sub word line driver group includes a fourth sub word line driver and the third sub word line driver of the first sub word line driver group is located between the first and fourth sub word line drivers of the first sub word line driver group, wherein the second sub word line driver group includes a fourth sub word line driver and the third sub word line driver of the second sub word line driver group is located between the first and fourth sub word line drivers of the second sub word line driver group, and wherein the decoding unit is configured to activate the first and fourth sub word line drivers of the first and second sub word line driver groups and inactivate the third sub word line driver of the first and second sub word line driver groups in response to the second test signal.

15. The semiconductor memory apparatus of claim 14, wherein the first to fourth sub word line drivers of the first sub word line driver group are coupled to respective word lines of the memory area, and wherein the first to fourth sub word line drivers of the second sub word line driver group are coupled to respective word lines of the memory area.

* * * * *